US008208285B2

(12) United States Patent
Khoury et al.

(10) Patent No.: US 8,208,285 B2
(45) Date of Patent: Jun. 26, 2012

(54) VERTICAL NON-VOLATILE SWITCH WITH PUNCHTHROUGH ACCESS AND METHOD OF FABRICATION THEREFOR

(75) Inventors: Maroun Georges Khoury, Burnsville, MN (US); Hyung-Kyu Lee, Edina, MN (US); Peter Nicholas Manos, Eden Prairie, MN (US); Chulmin Jung, Eden Prairie, MN (US); YoungPil Kim, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 28 days.

(21) Appl. No.: 12/502,089

(22) Filed: Jul. 13, 2009

(65) Prior Publication Data

US 2011/0007547 A1 Jan. 13, 2011

(51) Int. Cl.

| | |
|---|---|
| ***G11C 11/00*** | (2006.01) |
| ***G11C 11/14*** | (2006.01) |
| ***G11C 11/15*** | (2006.01) |
| ***G11C 7/00*** | (2006.01) |
| ***G11C 7/22*** | (2006.01) |
| ***G11C 7/12*** | (2006.01) |
| ***G11C 11/16*** | (2006.01) |

(52) U.S. Cl. .............. 365/148; 365/189.14; 365/189.15; 365/189.16; 365/158; 365/171; 365/173; 365/242

(58) Field of Classification Search .................. 365/158, 365/171, 173, 243, 243.5, 242, 225.5, 148, 365/163, 189.14, 189.15, 189.16
See application file for complete search history.

(56) References Cited

U.S. PATENT DOCUMENTS

| | | | | |
|---|---|---|---|---|
| 4,247,915 | A | 1/1981 | Bartlett | |
| 4,901,132 | A | 2/1990 | Kuwano | |
| 5,365,083 | A | 11/1994 | Tada | |
| 5,926,412 | A | 7/1999 | Evans, Jr. et al. | |
| 7,052,941 | B2 | 5/2006 | Lee | |
| 7,440,317 | B2 | 10/2008 | Bhattacharyya | |
| 7,738,279 | B2 | 6/2010 | Slesazeck et al. | |
| 2002/0055232 | A1 * | 5/2002 | Floyd et al. | 438/268 |
| 2002/0081822 | A1 | 6/2002 | Yanagita et al. | |
| 2004/0084725 | A1 | 5/2004 | Nishiwaki et al. | |
| 2005/0280061 | A1 | 12/2005 | Lee | |
| 2005/0280155 | A1 | 12/2005 | Lee | |
| 2008/0048327 | A1 | 2/2008 | Lee | |
| 2008/0108212 | A1 | 5/2008 | Moss et al. | |
| 2009/0072279 | A1 | 3/2009 | Moselund et al. | |

(Continued)

FOREIGN PATENT DOCUMENTS

DE 102008026432 A1 12/2009

(Continued)

OTHER PUBLICATIONS

U.S. Appl. No. 12/261,296, filed Oct. 30, 2008, Khoury, et al.

(Continued)

*Primary Examiner* — J. H. Hur
(74) *Attorney, Agent, or Firm* — Hall Estill Attorneys at Law

(57) ABSTRACT

A semiconductor device for accessing non-volatile memory cell is provided. In some embodiments, the semiconductor device has a vertical stack of semiconductor layers including a source, a drain, and a well. An application of a drain-source bias voltage to the semiconductor device generates a punch-through mechanism across the well to initiate a flow of current between the source and the drain.

17 Claims, 6 Drawing Sheets

230 234 N+ 242 DEPLETED REGION 244 236 PUNCHTHROUGH CHANNEL GATE 246 WL 238 DEPLETED REGION 240 248 N+ 232

250 264 DRIVER 258 252 260 266 DRIVER 254 DRIVER 262 256

U.S. PATENT DOCUMENTS

| | | | |
|---|---|---|---|
| 2009/0296449 | A1 | 12/2009 | Slesazeck et al. |
| 2010/0110756 | A1 | 5/2010 | Khoury et al. |
| 2011/0026307 | A1 | 2/2011 | Khoury et al. |

FOREIGN PATENT DOCUMENTS

| | | | |
|---|---|---|---|
| EP | 1329895 | A2 | 7/2003 |
| WO | 0062346 | A1 | 10/2000 |
| WO | 0215277 | A2 | 2/2002 |
| WO | 2005124787 | A2 | 12/2005 |
| WO | 2006100657 | A1 | 9/2006 |
| WO | 2007128738 | A1 | 11/2007 |

OTHER PUBLICATIONS

James M. Zahler, Anna Fontcuberta I Morral, Chang-Geun Ahn, Harry A. Atwater, Mark W. Wanlass, Charles Chu and Peter A Iles, "Wafer Bonding and Layer Transfer Processes for High Efficiency Solar Cells," NCPV and Solar Program Review Meeting, p. 723-726, (2003).

* cited by examiner

FIG. 1
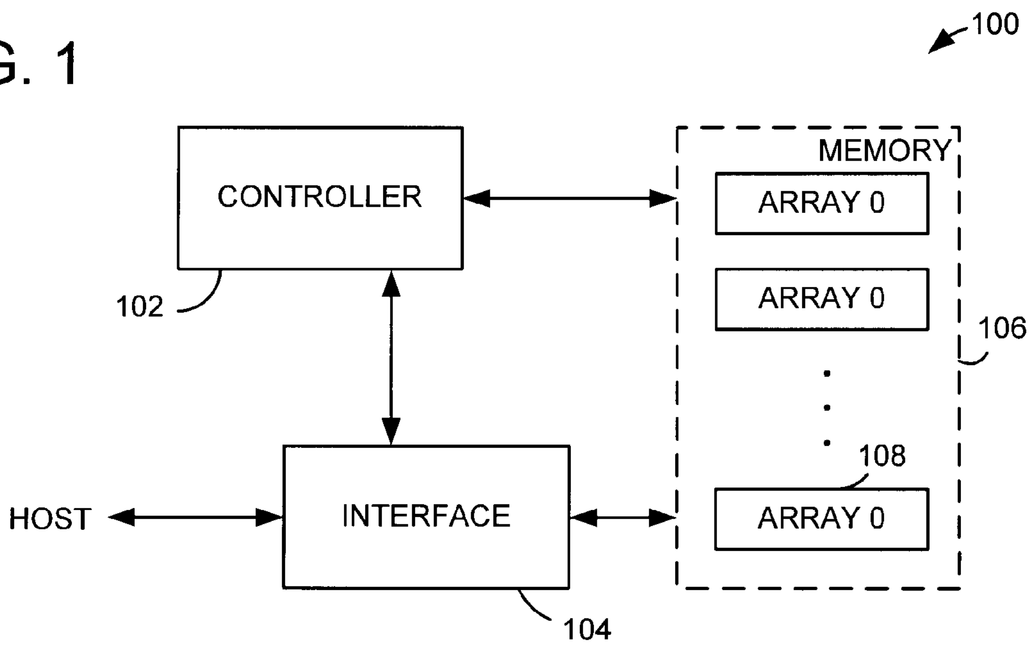
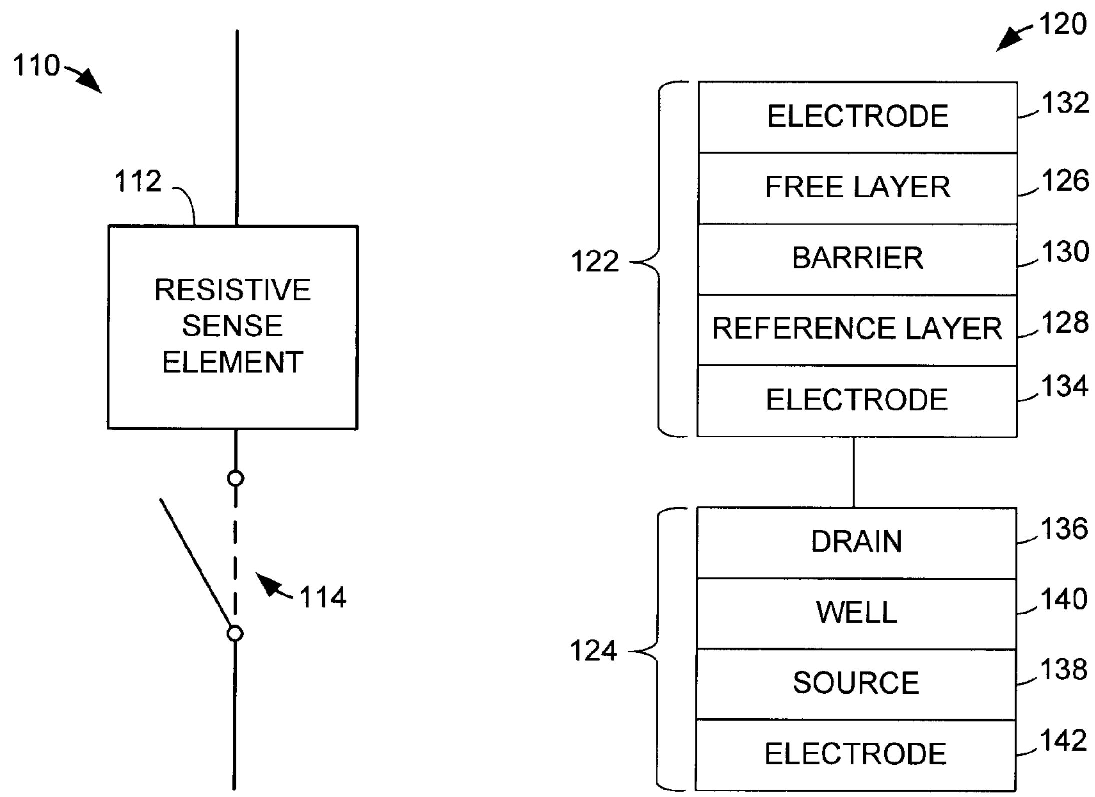
FIG. 2A
FIG. 2B 186
0.5Vp
0.5Vp
182
0V
0.5Vp
184
0.5Vp
180
Vp
178
174
184
0.5Vp
172
170
176
186
184

CURRENT
190
192
196
196
VOLTAGE
194

VERTICAL NON-VOLATILE SWITCH WITH PUNCHTHROUGH ACCESS AND METHOD OF FABRICATION THEREFOR

BACKGROUND

Data storage devices generally operate to store and retrieve data in a fast and efficient manner. Some storage devices utilize a semiconductor array of solid-state memory cells to store individual bits of data. Such memory cells can be volatile (e.g., DRAM, SRAM) or non-volatile (RRAM, STRAM, flash, etc.).

As will be appreciated, volatile memory cells generally retain data stored in memory only so long as operational power continues to be supplied to the device, while non-volatile memory cells generally retain data storage in memory even in the absence of the application of operational power.

In general, data storage devices including select devices are manufactured in a lateral configuration along a common substrate. However, as electronic devices become more complex, spatial problems such as noise and electrical shorts can cause inefficient operation of the device. As such, expansion of electrical components vertically can reduce spatial issues commonly encountered.

In these and other types of data storage devices, it is often desirable to increase efficiency and performance, particularly by reducing the horizontal surface area of a memory cell or select device.

SUMMARY

Various embodiments of the present invention are directed to a semiconductor device for accessing non-volatile memory cell.

In some embodiments, the semiconductor device has a vertical stack of semiconductor layers including a source, a drain, and a well. An application of a drain-source bias voltage to the semiconductor device generates a punchthrough mechanism across the well to initiate a flow of current between the source and the drain.

Further in various embodiments, a vertical stack of semiconductor layers has a source, a drain, and a well. AN application of a drain-source bias voltage generates a punchthrough mechanism across the well to initiate a flow of current between the source and the drain while at least one gate is positioned adjacent a sidewall of the semiconductor device In other embodiments, a memory device having a cross-point array of memory cells includes a vertical stack of semiconductor layers connected in series with a resistive sense element (RSE). The semiconductor device has a source, a drain, and a well to which application of a drain-source bias voltage generates a punchthrough mechanism across the well to initiate a flow of current between the source and the drain that programs the RSE to a selected resistive state.

These and various other features and advantages which characterize the various embodiments of the present invention can be understood in view of the following detailed discussion and the accompanying drawings.

BRIEF DESCRIPTION OF THE DRAWINGS

FIG. 1 is a generalized functional representation of an exemplary data storage device constructed and operated in accordance with various embodiments of the present invention.

FIG. 2A shows a memory cell capable of being used in the device of FIG. 1.

FIG. 2B displays an exemplary memory cell constructed in accordance with various embodiments of the present inventions.

DETAILED DESCRIPTION

Figure 3A:
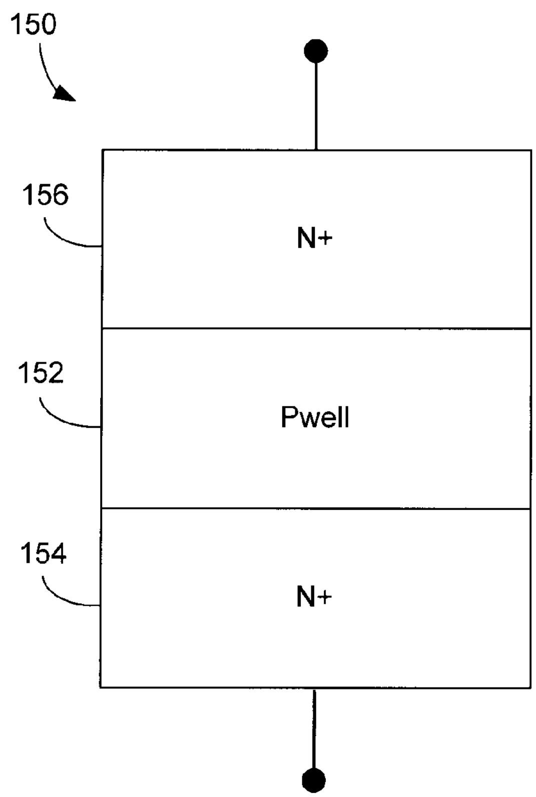
FIG. 3A shows an exemplary semiconductor switching device capable of being used in the memory cell of FIGS. 2A-2B.

FIG. 1 provides a functional block representation of a data storage device 100 constructed and operated in accordance with various embodiments of the present invention. Top level control of the device 100 is carried out by a suitable controller 102, which may be a programmable or hardware based microcontroller. The controller 102 communicates with a host device via a controller interface (I/F) circuit 104. A memory space is shown at 106 to comprise a number of memory arrays 108 (denoted Array 0-N), although it will be appreciated that a single array can be utilized as desired. Each array 108 comprises a block of semiconductor memory of selected storage capacity. Communications between the controller 102 and the memory space 106 are coordinated via the I/F 104.

FIG. 2A displays functional block representations of a memory cell 110 constructed and operated in accordance with various embodiments of the present invention. The memory cell 110 has a resistive sense element (RSE) 112 connected in series with a switching device 114. The switching device 114 functions to drastically increase the resistance of the memory cell 110 when in an open position, as shown, that effectively prevents current from passing. In contrast, a closed position allows the switching device 114 to receive current and pass it through the memory cell 110. A closed switching device 114 also allows current to pass through the RSE 112 in multiple directions.

Advantages of RSE cells over other types of non-volatile memory cells such as EEPROM and flash include the fact that no floating gate is provided in the cell construction. No erase operation is necessary prior to the writing of new data to an existing set of cells. Rather, RSE cells can be individually accessed and written to any desired logical state (e.g., a “0” or “1”) irrespective of the existing state of the RSE cell. Also, write and read power consumption requirements are substantially reduced, significantly faster write and read times can be achieved, and substantially no wear degradation is observed as compared to erasable cells, which have a limited write/erase cycle life.

However, a construction of a memory cell 110 with an RSE 112 and a switching device 114 connected in series can have disadvantages, such as large writing current and horizontal surface area requirements. For example, the RSE 112 can require large amounts of current to efficiently program data. Furthermore, a switching device 114 that can provide such high amount of current to the RSE often corresponds to large horizontal surface area. Hence, switching devices 114 with high drive currents that have a small horizontal surface area can improve the memory density and operational efficiency of existing memory devices.

Accordingly, a vertical semiconductor switching device can be used that selectively provides punchthrough conduction of current. A semiconductor switching device can be constructed with a vertical stack of semiconductor layers that includes a source, a drain, and a well where the application of a drain-source bias voltage generates a punchthrough mechanism across the well to initiate a flow of current between the source and the drain. Thus, a small horizontal surface area in combination with large volume current conduction can be implemented to achieve higher memory densities and faster write speeds.

FIG. 2B displays an exemplary memory cell 120 capable of being used in the memory space 106 of FIG. 1. The memory cell 120 can include an RSE 122 connected in series with a semiconductor switching device 124. In some embodiments, the RSE 122 consists of a spin-torque random access memory (STRAM) cell, as shown. Such an STRAM cell can have a free magnetic layer 126 and a fixed magnetic reference layer 128 bounding a barrier layer 130. While it can be appreciated that the barrier layer 130 can be characterized as a tunneling barrier constructed of numerous different materials, the various embodiments of the present invention do not limit the possible barrier layer 130 configurations.

Further, the STRAM cell can have a first electrode 132 and second electrode 134 positioned adjacent to the reference layer 128 and free layer 126, respectively. In some embodiments, the first and second electrodes 132 and 134 comprise spin polarizing material that uniformly orients the spin of current passing through the RSE 122.

Alternatively, the RSE 122 can be constructed as a resistive random access memory (RRAM) cell with a resistive storage layer disposed between a first electrode layer and a second electrode layer. As such, the RSE 122 would have a naturally high resistive value due to the composition and properties of the storage layer, which can be an oxide (such as titanium dioxide, $TiO_2$) with normally high electrical resistance. In operation, such an RRAM cell could be programmed to a low resistive state with the application of sufficient current to form a filament in the storage layer that connects the first and second electrode layers.

Additionally, a programmable metallization memory cell (PMC) can be utilized as the RSE 122 and constructed with a first electrode and a second electrode that bound a metal layer, embedded layer, and a dielectric layer. In some embodiments, an adjustment of the relative potential between the first and second electrodes can allow a write current to pass through the RSE 122 through a formed filament.

In yet another embodiment of the RSE 122, a phase change random access memory (PCRAM) cell can be used to store resistive states. An exemplary PCRAM cell can have a polycrystalline chalcogenide material media layer disposed between a first electrode and a second electrode. The unique behavior of chalcogenide glass of the media layer can allow the application of an amount of heat above the melting point of the chalcogenide material to form an amorphous chalcogenide corresponding to a high resistive state. In contrast, application of heat above the glass transition temperature of the chalcogenide material of the media layer, but below the melting point of the material will crystallize any existing amorphous chalcogenide and program a low resistive state.

As for the semiconductor switching device 124, a drain 136 and source 138 can be oriented vertically align and bound a well 140 of dissimilar material. In various embodiments, an electrode 142 is also coupled adjacent the source layer 138. In operation, the semiconductor switching device 124 can restrict current from flowing to the RSE 122 by not having a conductive pathway through the well layer 140. Conversely, the formation of conductive pathway can allow current to pass through the memory cell 120 in either direction.

It can be appreciated that the depiction of the RSE 122 and semiconductor switching device 124 in FIG. 2B is merely exemplary as numerous different configurations can be utilized to construct the memory cell. For example, a second barrier layer (not shown) can be coupled between the RSE 122 and semiconductor switching device 124 in part to prevent unwanted flow of current between the components. Furthermore, the orientations of the various layers of the RSE 122 and semiconductor switching device 124 can vary, as desired. That is, the physical orientation of the drain layer 136 and source layer 138 can be reversed without deterring from the spirit of the present invention.

However, it should be noted that in some embodiments the construction of the memory cell 120 is vertical in nature. That is, the various layers of both the RSE 122 and semiconductor memory device 124 are vertically aligned so that a vertically extending sidewall is formed on at least one side of the components. Likewise, the horizontal surface area of the memory cell 120 can be characterized as the length and width of the electrode layers 132 and 142 in contrast to the depth of the layers displayed in FIG. 2B.

Figure 3B:
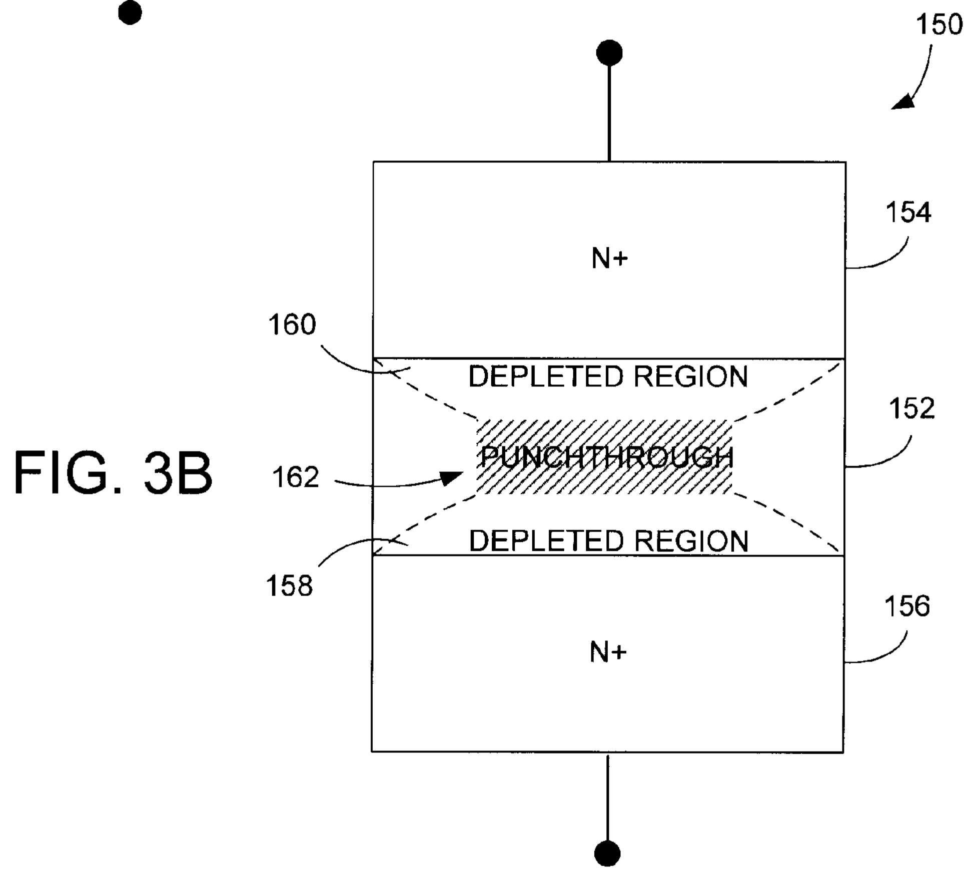
FIG. 3B displays an exemplary operation of the memory cell of FIG. 3A in accordance with various embodiments of the present invention.

In FIGS. 3A-3B, an exemplary semiconductor switching device 150 is shown as constructed and operated in accordance with various embodiments of the present invention. A Pwell layer 152 is disposed and vertically aligned between a source layer 154 and a drain layer 156. As shown, the source and drain layers 154 and 156 can be doped in a similar manner (e.g. N+ doped), but such doping is not required or limited. Furthermore, a skilled artisan can appreciate that the P doped material of the Pwell layer 152 can be used in the source and drain layers 154 and 156 just as the N dope material can be used in the Pwell layer 152. Such an alternative configuration could create a P—N—P vertical stack semiconductor switching device.

In operation, the semiconductor switching device 150 is voltage controlled so that the biasing of voltage between the source layer 154 and drain layer 156 will allow current to pass through the device 150. However, it should be noted that the various possible configurations of the switching device 150 could have a voltage bias restrict the flow of current through the device 150.

An exemplary operation of the semiconductor switching device 150 of FIG. 3A is generally illustrated in FIG. 3B in accordance with various embodiments of the present invention. A voltage potential differential between the source layer 154 and the drain layer 156 can create the merging of a source depleted region 158 and a drain depleted region 160. The region to which the depleted regions merge can be characterized as a punchthrough region 162. In some embodiments, biasing the voltage present between the source and drain layers 154 and 156 to a threshold ($V_p$) forms a highly conductive path from source layer 154 to drain layer 156, or vice versa, to which current can easily pass.

It should be noted that the locations and orientation of the various layers of the semiconductor switching device 150 are not limited and can be modified, as desired. For example, modifying the distance between the source layer 154 and the drain layer 156 can enlarge the punchthrough region 162. Likewise, the source and drain layers 154 and 156 can be reversed in position and/or doped with a different material, as discussed above. Furthermore, a modified punchthrough implant (not shown) can be inserted in the Pwell layer 152 to ensure a predetermined size and orientation of the punchthrough region 162. Such modifications can be facilitated in various manners to maintain vertical alignment device 150 as well as merging of the depleted regions 158 and 160 in a predetermined region 162.

Further in various embodiments, the semiconductor switching device 150 is bidirectional in that a conductive path can be formed through the punchthrough region 162 from either the source or the drain layers 154 or 156 and that conductive region can be maintained regardless of the presence of power to the device 150. However, the conductive path is not permanent as a change in bias can cause the dissipation of any conductive pathways. Thus, the semiconductor switching device 150 can operate as a bidirectional non-volatile device in various embodiments.

Figure 4:
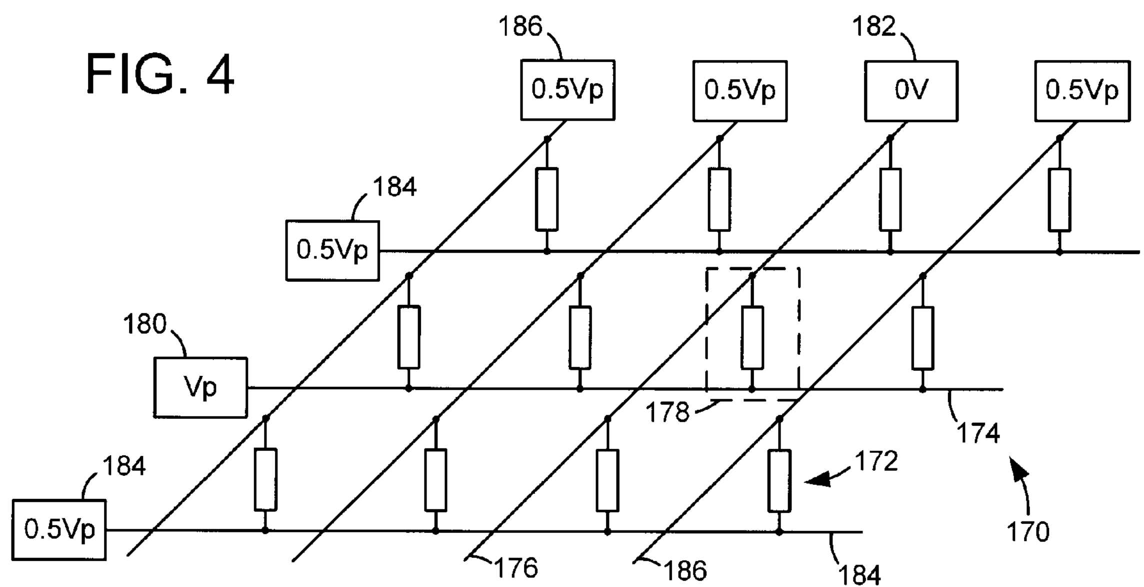
FIG. 4 illustrates an exemplary cross-point array of memory cells constructed and operated in accordance with various embodiments of the present invention.

FIG. 4 shows an exemplary cross-point array 170 constructed and operated in accordance with various embodiments of the present invention. The cross-point array 170 can have a plurality of memory cells 172, such as the memory cells 150 of FIGS. 3A and 3B, connected between a bit line 174 and a source line 176 and arranged into rows and columns. The cross-point array 170 can be configured, as displayed, to program a resistive state to a selected memory cell 178 by setting a bit line driver 180 to a predetermined high write voltage and setting the corresponding source line driver 182 to a low write voltage.

However, it can be appreciated that multiple memory cells can be programmed either simultaneously or successively along the various rows and columns. Similarly, it should be noted that the path of a write current through the selected memory cell 178 is not fixed and can be adjusted to the opposing direction with manipulation of the bit and source line drivers 180 and 182.

In an exemplary biasing scheme, a number of non-selected bit lines 184 and source lines 186 are precharged to a bias voltage (e.g. half the write voltage) to prevent leak current from being present during the reading or writing of the selected memory cell 178. That is, the combination of the semiconductor switching device in each memory cell 172 with the precharging of non-selected bit and source lines 184 and 186 can reduce or eliminate unwanted current from being generated from non-selected memory cells 172 during various read or write operations. For example, the non selected memory cells 172 will not experience a sufficient amount of bias between the precharged non-selected bit and source lines 184 and 186 to conduct current.

While the semiconductor switching device can be constructed and tuned to pass current a memory cell at a predetermined voltage, the precharging of the non-selected control lines 184 and 186 can eliminate a low voltage potential necessary to generate unwanted leak current. It should be noted that the precharging of non-selected bit and source lines 184 and 186 can be conducted in a biasing scheme, such configuration is not limited to the scheme and can be carried out, as desired. Likewise, the precharge voltage is not fixed or limited as various orientations can be utilized during either the writing or reading of data from a selected memory cell 178.

Figure 5:
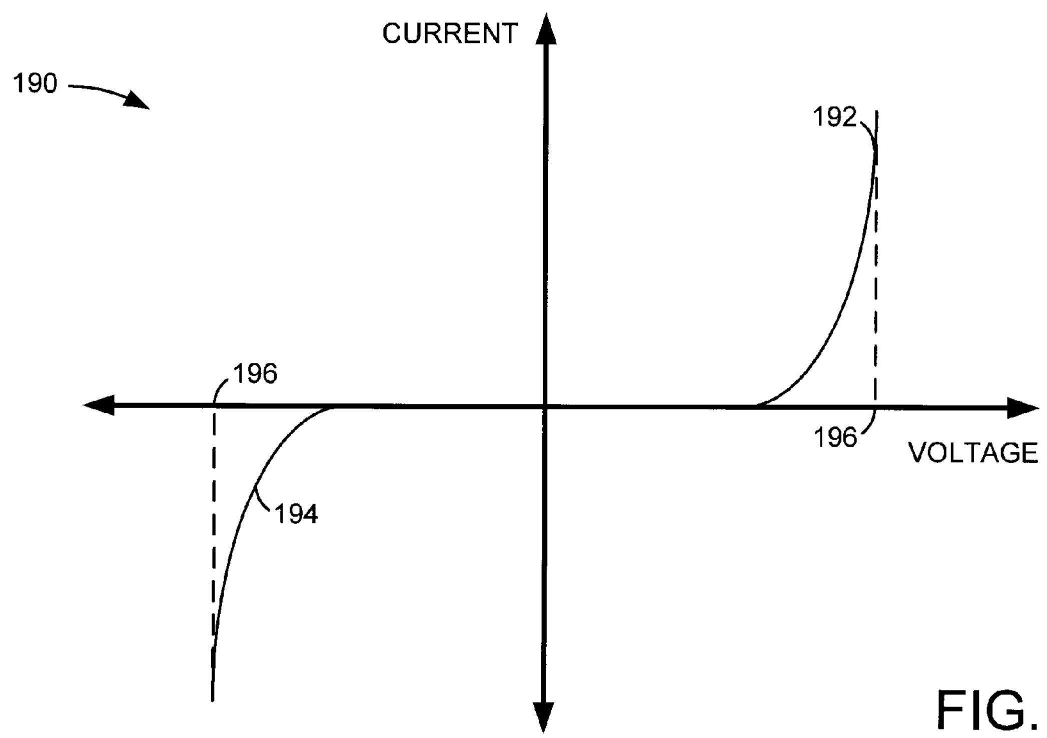
FIG. 5 graphs the operation of an exemplary semiconductor switching device.

In FIG. 5, exemplary operational characteristics 190 of a semiconductor switching device are graphed. As a semiconductor switching device receives a biased voltage, a conductive path through the punchthrough region is not created until a threshold voltage is reached, as displayed by line 192. However, as the threshold voltage is surpassed, the switching device reaches full conductive capacity quickly due to the large conductivity capability of the merged depleted regions in the punchthrough region.

Further, the switching device can exhibit inverse behavior when voltage of reverse polarity is applied. Hence, the bipolar and bidirectional characteristics of an exemplary semiconductor switching device are evident. Also of note, the current of the switching device rises rapidly at the threshold voltage in either polarity, as shown by segmented line 196.

An exemplary construction of a vertical semiconductor switching device 200 is displayed in FIGS. 6A-6D in accordance with various embodiments of the present invention. A vertical stack of semiconductor layers, including at least a source 202, drain 204, and Pwell 206 layers, that can be built with implantation and dopant activation on a donor wafer 208. In some embodiments, a metallic layer (not shown) can be deposited above the donor wafer 208 to enhance the bonding of the semiconductor layers to the wafer 208. However, the use of such metallic layer is not required or limited.

It should be noted that the various semiconductor layers can be doped in a variety of forms including N—P—N and P—N—P, as desired. Similarly, the various dopants can be a number of different materials including, but not limited to, boron, phosphorus, arsenic, indium, and antimony. While silicon can be used as the donor wafer 208, various techniques can alternatively be used to grow epitaxial layers of other semiconductors onto silicon (e.g. silicon germanium).

Likewise, the switching device is not limited to a single crystalline silicon. Such construction can be formed with a vertical epitaxy of silicon germanium, silicon, and silicon germanium to form a heterostructure. Various advantages can be experienced with the use of wafer bonding to facilitate vertical layer transfers such as improved manufacturing of complex structures and the ability to transfer a single layer of crystalline semiconductor material in a vertical orientation.

Figure 6A:
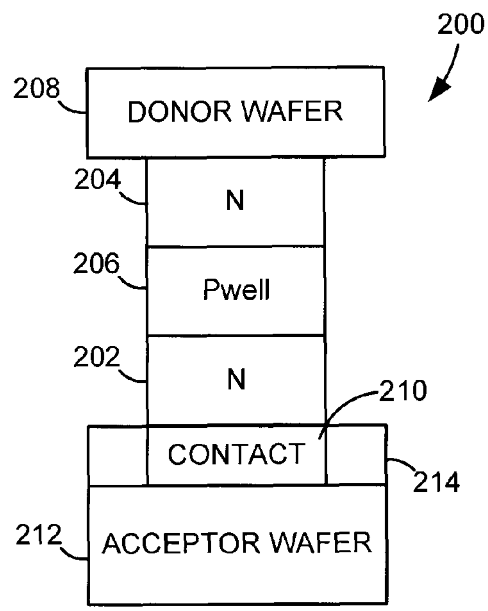
FIG. 6A-6D generally illustrates an exemplary manufacturing operation performed in accordance with various embodiments of the present invention.

Further in various embodiments shown in FIG. 6A, the semiconductor layers and donor wafer 208 are bonded to contact 210 positioned adjacent an acceptor wafer 212 and insulating material 214. Various bonding and vertical alignment techniques can be used to orient the switching device together, but no one technique is required or limited by the present invention. Likewise, the contact 210 can be constructed of various materials such as pure metals and metal alloys, but such construction is not limited.

Figure 6B:
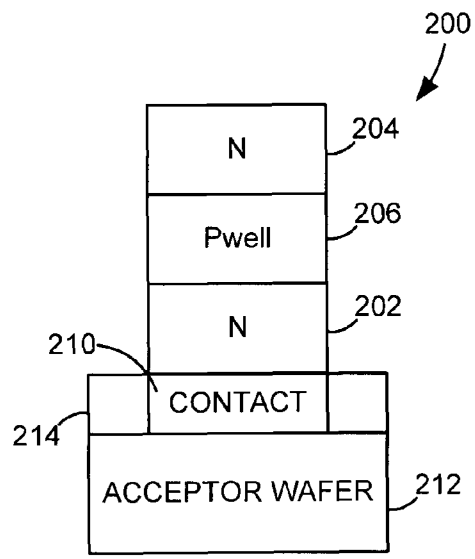

In FIG. 6B, the donor wafer 208 is removed while the contact 210, acceptor wafer 212, and insulating material 214 remain. Meanwhile, patterning and alignment of smaller individual switching devices may be carried out with or without alignment marks. Furthermore, various patterning operations can be performed to define the size of the switching devices before or after the bonding and detachment of the donor wafer 208. Such patterning operations are not limited, or required, and can be conducted, in some embodiments, concurrently with the formation of a resistive sense element.

Figure 6C:
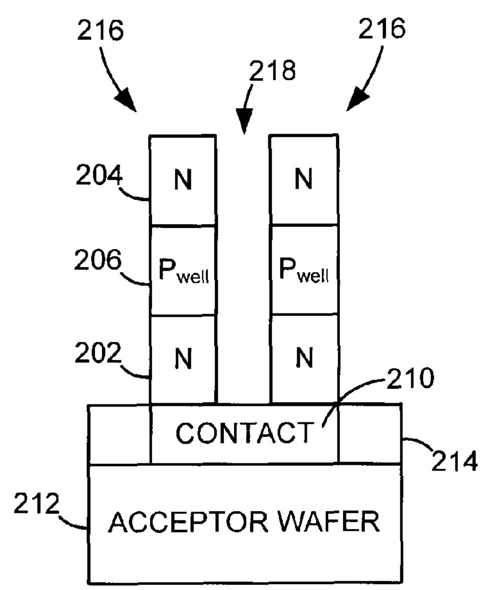

In regard to FIG. 6C, a plurality of individual semiconductor stacks 216 are separated by gap 218 while remaining bonded to the contact 210. While various separation techniques can be utilized without restriction or limitation, a chemical etching process can provide precise separation efficiently during manufacture. In some embodiments, such etching can be conducted by transferring a predetermined pattern from a photoresist layer through each semiconductor layer until reaching the contact 210.

In addition, at least one vertical sidewall of each individual stack 216 can be protected with insulating material via a variety of techniques. One such technique is passivation that forms a silicon dioxide, silicon oxynitride, or silicon nitride. Furthermore, the passivation can be done in a variety of manners including, but not limited to, plasma oxidation, plasma nitridation and low temperature dielectric deposition. However, none of the insulating materials or passivation operations are limited, restricted, or preferred.

Figure 6D:
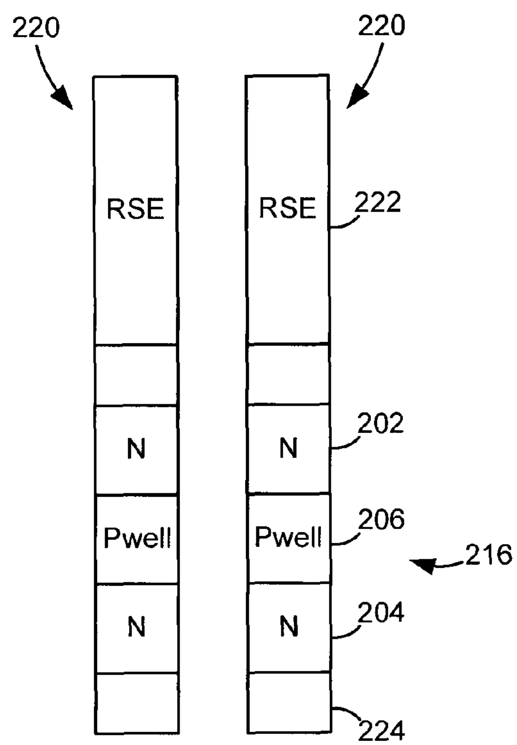

During various operations of a semiconductor switching device 200, a gate may be used. As such, a gate structure can be connected to the individual stack 216 during construction. Otherwise, a dielectric can be inserted in the gap 218 to fully isolate the stacks 216. Finally. FIG. 6D displays several memory cells 220 after being connected in series with an RSE 222. As discussed above, each switching device 200 can have an electrode 224 that may be constructed as a Schottky barrier with respect to the Pwell layer. It should be noted that the RSE 220 can be connected to the switching layers from above or below the electrode layer 224. As a result, each memory cell 220 can be utilized individually or included in an array of memory cells, such as the cross-point array 170 of FIG. 4.

In operation, the vertically aligned switching device 200 can be used to provide selective operation of the memory cell 220. The vertical orientation of the memory cell 220 can allow efficient surface area utilization of a data storage device. Accordingly, a switching device 200 constructed with wafer bonding, as displayed in FIGS. 6A-6D, can provide a selectively large conductive vertical pathway for a memory cell 220 to improve performance and surface area utilization.

Figure 7A:
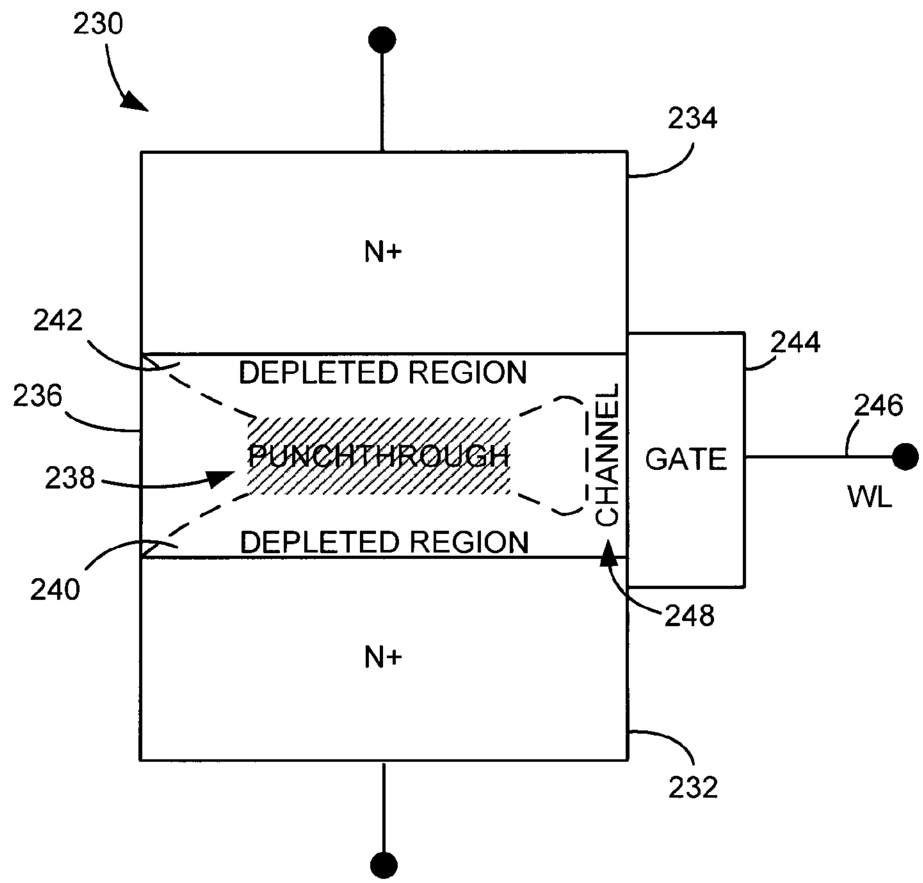
FIG. 7A shows an exemplary operation of a semiconductor switching device in accordance with various embodiments of the present invention.

FIG. 7A displays another exemplary semiconductor switching device 230 constructed and operated in accordance with various embodiments of the present invention. A source layer 232 and a drain layer 234 are vertically oriented and contactingly engage opposing sides of a Pwell layer 236. A punchthrough region can also be designed within the Pwell layer 230 with a specified configuration of the relationship between the source depleted region 240 and the drain depleted region 242. However, it should be noted that the punchthrough region 238 can be implemented in the Pwell layer 236 in a variety of different manners including, but not limited to, a modified punchthrough implant.

While various memory cell operations can be performed by the switching device 230, increased versatility can be achieved with the addition of a gate 244 positioned adjacent a sidewall of the switching device 230. One such versatile characteristic can be experienced when a voltage passes through the gate 244 and modulates a current from selected word line 246 and aids in reliably reading the resistive state present in a connected RSE. As can be appreciated, the gate 244 can be constructed as a metal floating gate that can exhibit particular characteristics to yield a bidirectional switching device.

Further, various operations can be conducted with a voltage connected to the gate 244 that can result in a conductive channel 248 being generated adjacent the sidewall of the Pwell 236 closest to the gate 244. In some embodiments, the conductive channel 248 is a MOSFET channel in that it exhibits characteristics similar to a metal oxide semiconductor field effect transistor (MOSFET) with respect to the conduction of current through a switching device. However, the switching device 230 can be configured to function with multiple conductive paths from source layer 232 to drain layer 234, or vice versa. That is, current can be conducted through both the punchthrough region 238 and the conductive channel 248 simultaneously or in succession based on the selected configuration of the switching device 230. Furthermore, the switching device 230 can also be configured to conduct current through either the punchthrough region 238 or the conductive channel 248, exclusively.

In sum, the switching device 230 can be selectively configured to generate the conductive channel 248 during particular predetermined situations. Such situations may utilize the conductive channel 248 in a parasitic capacity, such as during various read operations. However, the generation of the conductive channel 248 and the presence of the gate 244 is not required or limited in the use of the switching device 230.

Alternatively, one or more gates 244 can be utilized to selectively tune the switching device 230 to correspond to predetermined operational characteristics. For example, multiple gates 244 can generate multiple conductive channels 248 on opposing sides of the Pwell layer 238 to selectively adjust a threshold voltage potential bias required to conduct current through the punchthrough region 238. That is, the minimum voltage bias necessary to conduct current through the punchthrough region 238 can be modified with various gate 244 and conductive channel 248 functions.

Figure 7B:
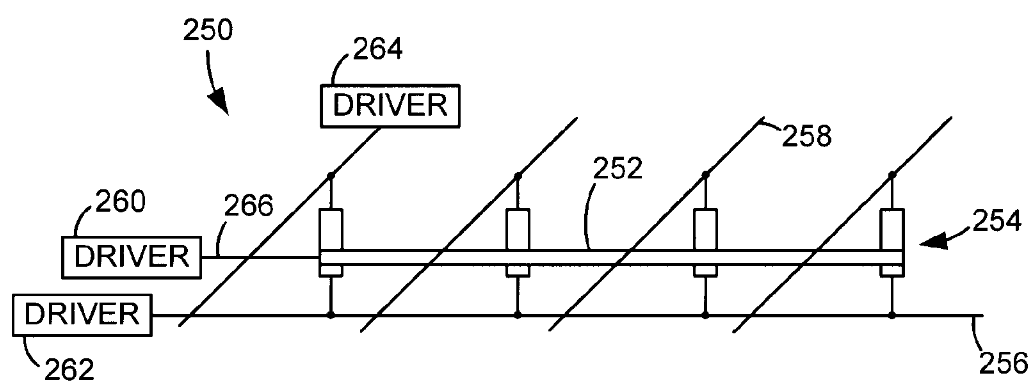
FIG. 7B displays an exemplary construction of a row of memory cells in a cross-point array of memory cells.

FIG. 7B generally illustrates an exemplary operation of a cross-point array 250 with memory cells constructed with the switching device 230 of FIG. 7A. A single gate structure 252 can be used to selectively operate the memory cells 254 connected between a bit line 256 and a source line 258. As displayed, the gate structure 252 can be positioned adjacent to multiple memory cells 254 along a row, but such orientation is not limited as the gate structure can be positioned along a column of memory cells, individually or in combination with a row gate structure 252. Control of the gate structure 252 can be facilitated by a word line driver 260 in a similar fashion to the bit line driver 262 and source line driver 264. However, the number and size of the various line drivers 260, 262, and 264 are not limited as one, or many, drivers can be utilized in the cross-point array 250.

It should be noted that the gate structure 252 can be configured to be isolated to a single memory cell 254 and connected to other gate structures along a row or column by the word line 266. In contrast, various embodiments of the present invention are constructed so that the gate structure 252 spans multiple rows or columns in the cross-point array 250. Furthermore, the biasing scheme, discussed above, can be operated to require a single gate contact while enhancing conduction through the switching device.

Figure 8:
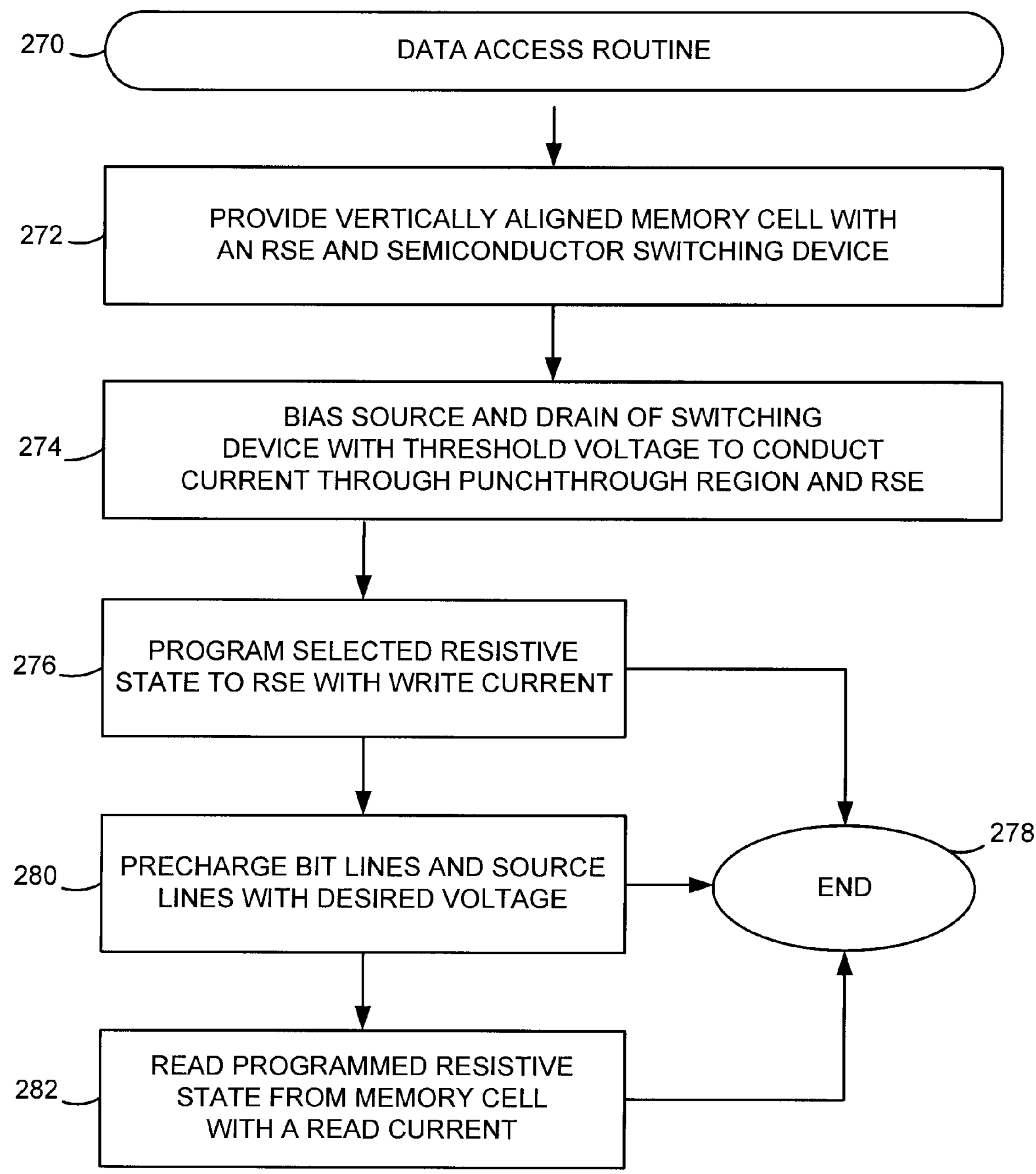
FIG. 8 provides a flowchart of a data access routine performed in accordance with various embodiments of the present invention.

FIG. 8 provides a flowchart of a data access routine 270 performed in accordance with various embodiments of the present invention. Initially at step 272, a vertically aligned memory cell is provided that with an RSE connected in series with a semiconductor switching device. In some embodiments, the memory cell is positioned in a cross-point array of memory, but such orientation is not limited. The switching device is activated at step 274 with the biasing of the source and drain layers with a threshold voltage that allows conduction of a current through the punchthrough region of the Pwell layer of the switching device. As discussed above, the threshold voltage, activation, and operation of the switching device can include a gate structure.

In addition, a selected resistive state is programmed to the RSE of the memory cell in step 276 while the switching device is activated. While the data access routine 270 can proceed to end with step 278, the programmed resistive state can further be read by advancing from step 276 to step 280 or step 282, depending on the orientation of the memory cell in a cross-point array. If the memory cell is in a cross-point array, a biasing scheme can be conducted in step 280 that precharges non-selected bit and source lines to reduce or eliminated unwanted leak current.

In step 282, the resistive state of the previously programmed memory cell is read with a read current that has a magnitude less than the write current used in step 276. It can be appreciated that the various configurations of the memory cell in an array is not limited to a cross-point array. Likewise, any number of memory cells can be simultaneously or consecutively read or written with the various steps of the data access routine 270. Furthermore, the various steps of the data access routine 270 are not exclusive and can be modified in timing and operation without deterring from the spirit of the present invention. For example, a resistive state can be read without previously programming a resistive state to the RSE.

As can be appreciated by one skilled in the art, the various embodiments illustrated herein provide advantageous access to a memory cell. The use of a punchthrough region to conduct large amounts of current through a semiconductor switching device allows for scaleable memory cells that can be reliably programmed with predetermined pulses. With the versatility of the semiconductor switching device being bidirectional and bipolar, the complexity of a conventional array of memory cells is greatly reduced while improving storage capacity. However, it will be appreciated that the various embodiments discussed herein have numerous potential applications and are not limited to a certain field of electronic media or type of data storage devices.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A semiconductor device comprising a vertical stack of semiconductor layers comprising a source, a drain, and a well connected to first and second gates respectively corresponding to first and second conductive channels through the well, application of a drain-source bias voltage with a first gate voltage during a write operation generates a punchthrough mechanism across the well to initiate a flow of bidirectional current between the source and the drain, and application of a second gate voltage, different from the first gate voltage, during a read operation initiates flow of bidirectional current through the punchthrough mechanism and at least one conductive channel.

2. The semiconductor device of claim 1, in combination with a resistive sense element (RSE) to form a memory cell, wherein said flow of current programs the RSE to a selected resistive state.

3. The semiconductor device of claim 2, wherein the RSE comprises a spin-torque transfer random access memory (STRAM) cell.

4. The semiconductor device of claim 1, wherein the punchthrough mechanism extends adjacent each conductive channel in said well and each gate is positioned adjacent a sidewall of the semiconductor device.

5. The semiconductor device of claim 1, wherein the punchthrough mechanism is generated with bidirectional voltage.

6. The semiconductor device of claim 1, wherein the gate is positioned adjacent a plurality of multiple memory cells along a row.

7. The semiconductor device of claim 1, wherein the first and second gate voltages are tuned to conduct different amounts of current through from the source to the drain.

8. The semiconductor device of claim 1, wherein the first gate voltage conducts current through the punchthrough mechanism and a MOSFET channel simultaneously.

9. A semiconductor device comprising a vertical stack of semiconductor layers comprising a source, a drain, and a well, wherein application of a drain-source bias voltage generates a punchthrough mechanism across the well to initiate a flow of current between the source and the drain, and wherein at least one gate is positioned adjacent a sidewall of the semiconductor device and a voltage passed through the gate tunes a threshold bias voltage to a first value during a write operation and a different second value during a read operation to generate the punchthrough mechanism.

10. The semiconductor device of claim 9, wherein the well has a punchthrough implant that defines a punchthrough region where the punchthrough mechanism transpires.

11. The semiconductor device of claim 9, wherein the second value corresponds to conduction through a conductive channel and the punchthrough mechanism.

12. The semiconductor device of claim 9, wherein current can bidirectionally flow between the source and drain.

13. A memory device comprising a cross-point array of memory cells comprising a vertical stack of semiconductor layers connected in series with a resistive sense element (RSE), wherein the semiconductor device comprises a source and drain each constructed of N doped material, at least one gate, and a well constructed of P doped material, and wherein application of a first drain-source bias voltage generates a punchthrough mechanism across a first conductive channel of the well and a gate voltage generates a second conductive channel of the well to initiate a bidirectional flow of current between the source and the drain that programs the RSE to a selected resistive state and a second drain-source bias voltage, different from the first drain-source bias voltage, generates a punchthrough mechanism across the well to initiate a bidirectional flow of current that reads the resistive state of the RSE.

14. The memory device of claim 13, wherein a single gate is positioned adjacent to multiple semiconductor devices.

15. The memory device of claim 13, wherein a biasing scheme is used to program a resistive state to a predetermined RSE without a leak current being generated.

16. The memory device of claim 13, wherein each drain-source bias voltage is provided by a first gate positioned adjacent the well.

17. The memory device of claim 13, wherein a first gate generates a third conductive channel through the well and a second gate positioned adjacent the well and opposite the first gate generates the second conductive channel through the well.

* * * * *